United States Patent
Itou

(10) Patent No.: US 7,477,544 B2
(45) Date of Patent: Jan. 13, 2009

(54) STORAGE DEVICE

(75) Inventor: Masaru Itou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 122 days.

(21) Appl. No.: 11/319,599

(22) Filed: Dec. 29, 2005

(65) Prior Publication Data

US 2007/0064481 A1  Mar. 22, 2007

(30) Foreign Application Priority Data

Sep. 20, 2005  (JP) ............................. 2005-272144

(51) Int. Cl.
 *G11C 11/34* (2006.01)
(52) U.S. Cl. ............................. 365/185.04; 365/185.21; 365/185.22; 365/189.15
(58) Field of Classification Search ............ 365/185.03, 365/185.04
 See application file for complete search history.

(56) References Cited

U.S. PATENT DOCUMENTS

| | | | | |
|---|---|---|---|---|
| 7,117,474 | B2 * | 10/2006 | Liardet et al. ................. | 716/17 |
| 2004/0059884 | A1 * | 3/2004 | Iwasaki ...................... | 711/163 |
| 2006/0095699 | A1 * | 5/2006 | Kobayashi et al. .......... | 711/164 |

FOREIGN PATENT DOCUMENTS

| | | |
|---|---|---|
| EP | 0 509 567 A2 | 10/1992 |
| JP | 5-88986 | 4/1993 |
| JP | 09-016477 | 1/1997 |
| JP | 10-320293 | 12/1998 |
| JP | 11-328036 | 11/1999 |
| JP | 2001-195307 | 7/2001 |
| JP | 2001-202167 | 7/2001 |
| JP | 2002-073422 | 3/2002 |

* cited by examiner

*Primary Examiner*—VanThu Nguyen
*Assistant Examiner*—Han Yang
(74) *Attorney, Agent, or Firm*—Staas & Halsey LLP

(57) ABSTRACT

Memory cell can stores a multi-valued value more than a binary value in a single storage cell by changing the amount of electric charge to be stored. Data logic stores storage data, each digit of which is binary as a binary value in each memory cell for each digit. Furthermore, the data logic determines whether a read request for storage data is legal. If the read request is legal, the data logic relates the amount of electric charge stored in the memory cell to a binary value. If it is illegal, the data logic relates the amount of electric charge stored in the memory cell to the above-mentioned multi-valued value. Then, the data logic outputs data obtained by arraying the related values in each digit as the requested storage data.

5 Claims, 7 Drawing Sheets

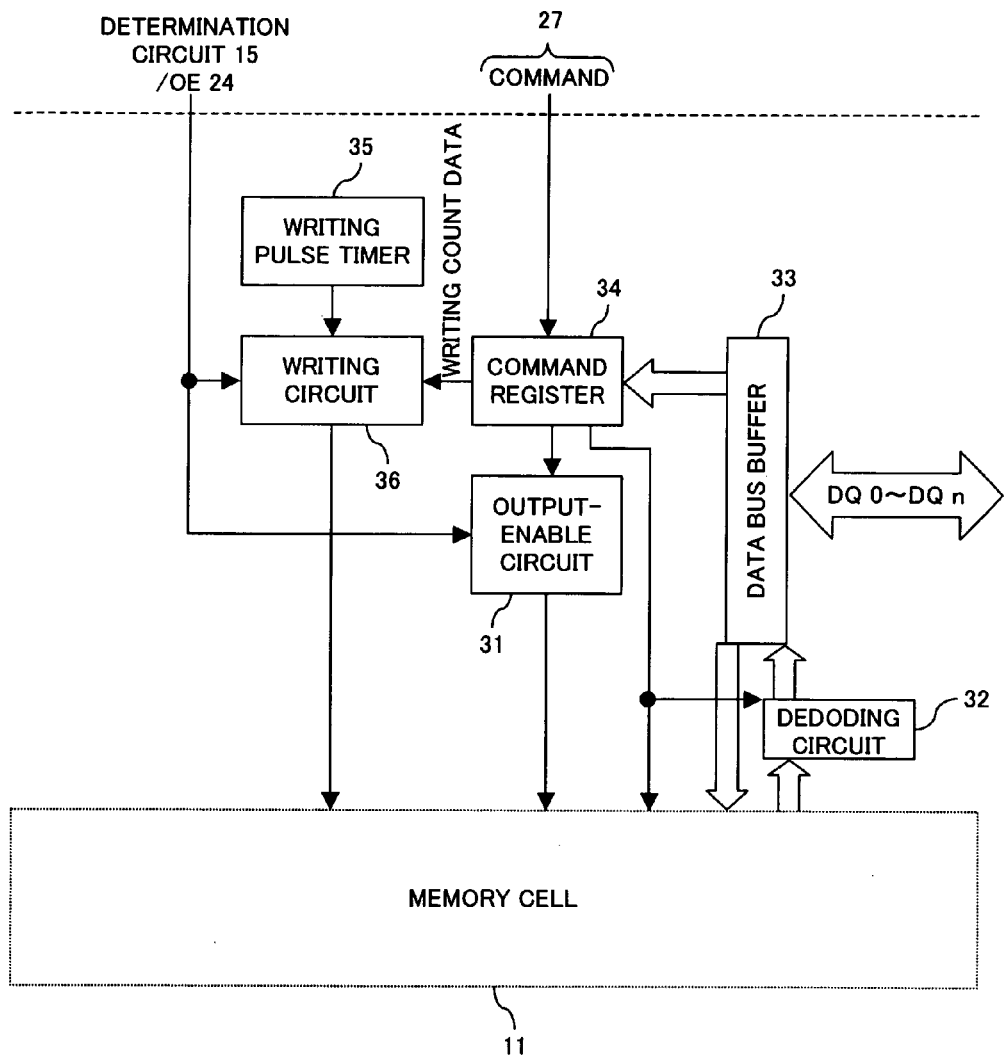
F I G. 2

US 7,477,544 B2

STORAGE DEVICE

BACKGROUND OF THE INVENTION

1. Field of the Invention

The present invention relates to information storage, and more particularly relates to a technology preventing the steal of information.

2. Description of the Related Art

As a technology for preventing data stored in a semiconductor device, such as memory or the like, from being illegally read by a third party, a variety of technologies have been traditionally proposed.

For example, Japanese Patent Application No. H5-88986 discloses a technology for destroying information stored in information storage means of a capsule when the electric field of a piezoelectric material forming the capsule changes.

Japanese Patent Application Nos. 2001-195307 and H11-328036 discloses a technology for erasing information stored in non-volatile memory when voltage drop due to removing a thin film battery in order to observe an IC chip is detected.

Japanese Patent Application No. H10-320293 discloses a technology for providing a sensor for detecting the opening of an IC card and erasing the data of non-volatile memory in an IC card when the opening is detected.

Japanese Patent Application No. H9-16477 discloses a technology for removing the backup of the secondary storage device storing a decoding key to erase the decoding key when the primary storage device storing secrete data is disconnected from a bus line.

Japanese Patent Application No. 2002-73422 discloses a technology for breaking down data to be stored into a plurality of data pieces, any one of which has no meaning, storing each of them in different memory and erasing data stored in memory other than the removed one when the illegal removal of data in any of them is detected.

Japanese Patent Application No. 2001-202167 discloses a technology for encoding memory contents in a computer when there is an instruction to switch its computer power off or an instruction to enter a power-saving operation state, and for decoding the memory contents in the computer when there is an instruction to switch the computer power on or to return to a normal operation state.

Since some of the above-described technologies erase data against an illegal reading operation, even a regular user cannot regain the lost data after the illegal reading.

Since some of the above-described technologies use an encryption technology, the encoding/decoding gives a heavy process load to a system. Therefore, it is not easy for a system without any allowance in a processing capacity to adopt them.

SUMMARY OF THE INVENTION

It is an object of the present invention to prevent information represented by data stored in a semiconductor device from being illegally obtained by a third party.

The semiconductor storage device in one aspect of the present invention comprises a semiconductor storage element comprising a plurality of storage cells each capable of storing a multi-valued information more than a binary one by changing an amount of electric charge to be stored within a storage cell, a storage control unit for storing storage data, each inputted digit of which is binary, in each of the storage cells as a multi-valued information for each digit, a detection unit for detecting the amount of electric charge stored in the storage cell, a determination unit for determining whether the read request is an authorized request, a correspondence unit for relating the detected amount of electric charge to a binary value when the read request is legal and relating the detected amount of electric charge to the multi-valued value when the read request is illegal and an output unit for outputting data obtained by arraying the related value in each digit as requested storage data.

According to the above-described configuration, a third party which cannot request for illegal reading reads a value stored in the storage cell as a binary value as a four-valued value. Thus, storage data can be prevented from being illegally obtained. However, if it is legally requested to read, data is obtained a binary value which is properly related to the amount of electric charge if a cell. Thus, storage data can be correctly read.

In the above-described semiconductor storage device of the present invention, the determination unit can also determine whether the read request for stored data is legal, by determining whether externally inputted identification information coincides with pre-stored identification information.

Thus, it can be determined whether the requester is a legal user, based on whether the requester knows identification information.

In the above-described semiconductor storage device of the present invention, the detection unit can also detect the amount of electric charge of the storage cell by detecting its voltage value.

In the above-described semiconductor storage device of the present invention, the storage control unit can also relate each binary value of each digit in the inputted storage data to one of the multi-valued value and store the related multi-valued value in each storage cell, and the correspondence unit can also relate each binary value, based on the detected amount of electric charge, according to the correspondence of the storage control unit when the read request is legal.

Thus, when a legal read request is received, storage data can be correctly outputted.

In this case, the storage control unit can also determine the correspondence, based on externally inputted identification information.

Thus, since correspondence can be modified according to identification information, it becomes difficult to illegally obtain storage data.

According to the present invention, thus it becomes difficult for a third party to illegally obtain information represented by data stored in the semiconductor storage device.

BRIEF DESCRIPTION OF THE DRAWINGS

The present invention will be more apparent from the following detailed description when the accompanying drawings are referenced.

FIG. 2 shows the detailed configuration of data logic.

DESCRIPTION OF THE PREFERRED EMBODIMENTS

The preferred embodiments of the present invention are described below with reference to the drawings.

Figure 1:
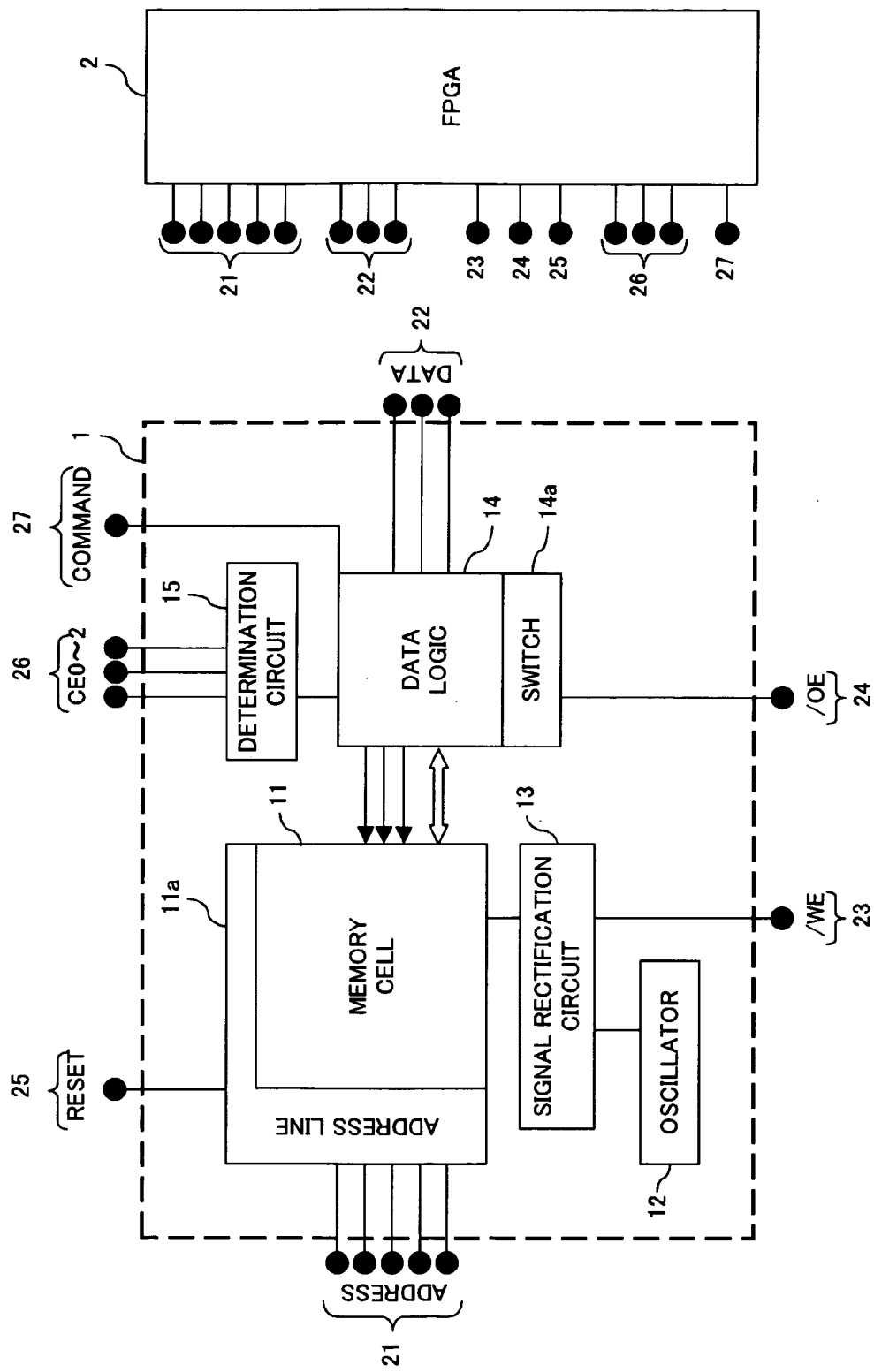
FIG. 1 shows the configuration of the semiconductor storage device of the present invention.

Firstly, FIG. 1 is described. FIG. 1 shows the entire configuration of the semiconductor storage device of the present invention.

In FIG. 1, a semiconductor storage device 1 is flash memory. A field programmable gate array (FPGA) 2 is external equipment using the semiconductor storage device 1 (in this application called "storage management device"). Each of an address terminal 21, a data terminal 22, a write-enable (/WE) terminal 23, an output-enable (/OE) terminal 24, a reset (RESET) terminal 25, chip-enable (CE0-2) terminals 26 and a command terminal 27 is connected to the corresponding terminal of the FPGA 2.

In the semiconductor storage device 1, a memory cell 11 being a semiconductor storage element is a so-called multi-level memory cell (also called "multi-bit memory cell"), specifically it comprises a plurality of cells capable of storing a multi-valued value more than one bit value (binary value) in one cell. In this preferred embodiment, two bit values (four-valued value) can be stored in one cell.

The multi-level bit cell stores a plural-valued value in one cell by changing the amount of electric charge to be stored, according to a value to be stored. When writing data, in order to change the amount of electric charge to be stored, a time for applying a writing voltage to a cell (or time for reducing the specific stored amount of electric charge of a cell at a specific rate) is modified according to a value to be stored. When reading data, the stored amount of electric charge of a cell is extracted as its output voltage, and data corresponding to the output voltage value is outputted as stored data.

When the FPGA 2 inputs an address to the address terminal of the semiconductor storage device 1, a memory cell 11 used to store data for one word corresponding to the address is accessed and selected via address line 11a. Then, a cyclic pulse signal generated by an oscillator 12 is inputted to a signal rectification circuit 13. The signal rectification circuit 13 converts the signal level of the inputted pulse signal into a signal level needed to write data in the memory cell 11.

When writing data in the address, the FPGA 2 inputs the data to the data terminal 22 to activate the write-enable terminal 23. Then, data logic 14 determines a time (the umber of pulses), based on the data. Then, the pulse signal from the rectification circuit 13 is supplied to the selected memory cell 11 for the time. Thus, each memory cell stores the amount of electric charge corresponding to data/number of pulses to be written. However, if the FPGA 2 inputs identification information (key data), which will be described later, to the command terminal 27 in series, a time for supply the pulse signal from the signal rectification circuit 13 to the memory cell 11 is changed according to the key data.

Although the data logic 14 operates as described above when writing data, it operates differently when reading data.

If the FPGA 2 activates the output-enable terminal 24 when reading data specified by the address inputted to the address terminal 21 of the semiconductor storage device, a switch 14a switches the data logic 14 to reading logic. Then, the data logic 14 detects the voltage value of a four-valued value corresponding to the amount of electric charge stored in the memory cell selected by the address, converts the voltage value (that is, the amount of electric charge) into the original writing data and outputs the data to the data terminal 22. However, this conversion is correctly made only when the FPGA 2 inputs the key data to the command terminal 27.

When the correct key data is not inputted, the data logic 14 outputs the detected amount of electric charge to the data terminal 22 as simple four-valued data different from the original writing data. As a result of this, the original writing data is protected.

Besides, the reset terminal 25 is used for the FPGA 2 to instruct the erase of data stored in the memory cell 11 (to restore the stored amount of electric charge to its initial state). The chip-enable terminal 26 is used to simultaneously use a plurality of semiconductor storage devices. Specifically, only when a determination circuit 15 determines that this semiconductor storage device 1 is selected by an input from the FPGA 2 to the chip-enable terminal 26, the data logic 14 functions.

Next, FIG. 2 is described. FIG. 2 shows the detailed configuration of data logic 14 shown in FIG. 1.

Firstly, its data writing operation of the configuration shown in FIG. 2 is described.

When the determination circuit 15 determines that this semiconductor storage device 1 is selected by an input from the FPGA 2 to the chip-enable terminal 26 and also the write-enable terminal 23 is activated, a writing operation is started. However, when the writing data is protected, the FPGA 2 also inputs the key data to the command terminal 27. This key data is a series of unique numerical data of the semiconductor storage device 1. The FPGA 2 records in advance the key data of a semiconductor storage device connected to the FPGA 2.

Then, the FPGA 2 inputs the writing data to the data terminal 22. The inputted writing data is temporarily stored in a data bus buffer 33.

Then, a command register 34 reads the writing data from the data bus buffer 33. Then, the FPGA 2 generates writing count data, based on this writing data and the above-describe key data. The writing count data is data for setting the time of a pulse signal applied from the signal rectification circuit 13 to a memory cell 11 selected the input to the address terminal 21. As soon as the signal rectification circuit 13 starts applying a pulse signal to the selected memory cell, the writing pulse timer 35 starts counting at a specific time interval. For example, if a command register 34 generates "20" as a writing count data value, the pulse signal is applied to the memory cell 11 until a writing circuit 36 detects that the writing pulse timer 35 counts "20". As a result of this, the amount of electric charge corresponding to the applied time is stored. Thus the data writing is completed.

Figure 3:
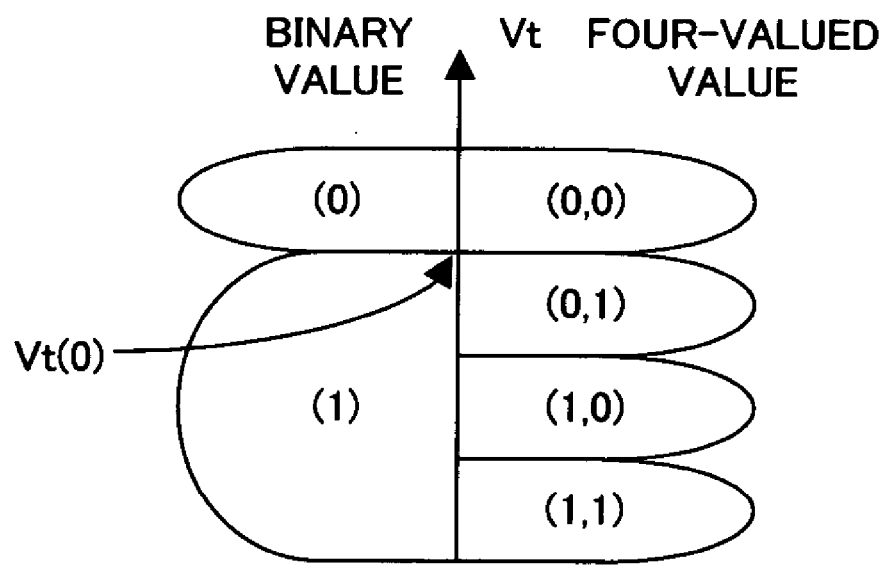
FIG. 3 shows an example of the correspondence between the amount of electric charge of each cell and data when writing and reading data.

The command register 34 converts the binary data (one bit data, "0" or "1") of each digit of the writing data stored in the data bus buffer 33 into four-valued (two-bit) data. In this conversion from single bit data into multi-bit data, for example, as shown in FIG. 3, a value "0" in binary data is related to (0, 0) in four-valued (two-bit) data, and also "1" in binary data is related to any of (0, 1), (1, 0) and (1, 1) in our-valued data. However, to which of these three the command register 34 relates "1" is determined the key data.

The key data is a series of numerical data. When writing data this key data is used as writing count data. The above-described correspondence is differentiated for each writing data digit, by selecting and using a part of a series of numerical data being key data, according to prescribed conditions.

When the key data is not inputted, that is, when writing data is not protected, the command register 34 sequentially extracts the writing data stored in the data bus buffer 33 by two digits to prepare four-valued data for each digit and storing this data in the memory cell selected by inputting an address to the address terminal 21.

Next, its data reading operation is described.

If the determination circuit 15 determines that this semiconductor storage device 1 is selected by input from the FPGA 2 to the chip-enable terminal 26 and also the output-enable terminal 24 is activated, an output-enable circuit 31 inputs the output voltage of a selected cell in the memory cell 11 to a decoding circuit 32. If no key data is inputted to the command terminal 27, the decoding circuit 32 converts the cell voltage (the amount of electric charge stored in the cell) into four-valued data and stores in the data bus buffer 33. When the data of all bits is stored in the data bus buffer 33, the data is outputted from the data bus buffer 33 to the data terminal 22 (FIG. 1).

However, if in this preferred embodiment, key data is inputted to the command terminal 27, a reading operation different from the above-described is performed, specifically, the writing data protected in the above-described writing operation is correctly read.

When the FPGA 2 inputs key data to the command terminal 27 in series, the command register 34 suppresses the above-described operation of the output-enable circuit 31, while selects a specific cell from the memory cell 11 and inputs the output voltage of the cell to the decoding circuit 32.

Since as earlier described, the key data is peculiar to each semiconductor storage device 1, the key data of the semiconductor storage device 1 is written in advance in the specific cell of the semiconductor storage device 1 as read-only (erasable/rewritable) storage identification information.

The decoding circuit 32 converts the cell voltage into four-valued data and stores the data in the data bus buffer 33. When the data of all bits is stored in the data bus buffer 33, the command register 34 determines whether the data stored in this data bus buffer 33 (storage identification information) coincides with the earlier-described key data (identification information).

If both are matched, it is determined that a legal read request for stored data is made (a legal read request is made by external equipment which knows the storage identification information of the semiconductor storage device 1). In this case, the command register 34 controls the decoding circuit 32 to modify the correspondence between the output voltage (that is, the stored amount of electric charge) of the memory cell 11 with output data. Specifically, for example, as shown in FIG. 3, although so far four-valued values of (0, 0), (0, 1), (1, 0) and (1, 1) are related in descending order of the output voltage of the cell, the correspondence is modified in such a way that "0" is related to an output voltage corresponding to (0, 0) and "1" is related to all the output voltages lower than (0, 0). In other words, in this case, the correspondence is modified in such a way that only binary data is related to a multi-level memory cell for each cell. In FIG. 3, voltage Vt(0) is constant and is the output voltage of a cell being a threshold value by which a relating value should be "0" or "1" in the case where the output voltage is related to binary data.

If the key data inputted to the command terminal 27 does not coincide with the storage identification information of the semiconductor storage device 1, the command register 34 does not suppress the operation of the output-enable circuit 31 and performs the earlier-described data reading operation as when no key data is inputted to the command terminal 27.

After that, the output voltage of a cell is converted into binary data in the decoding circuit 32 in which the correspondence is modified, is stored in the data bus buffer 33 and outputted to the data terminal 22. Therefore, if data is written in the semiconductor storage device in such a way that correct data can be read only when the same key data as storage identification information is inputted, a third party cannot obtain correct data.

By storing writing data in the semiconductor storage device under the above-described storage control, a third party that does not know its key data cannot make a legal read request for stored data and can read the writing data only as correspondence-unknown four-valued data. In other words, in the semiconductor storage device of the present invention, since effective single bit data is stored in multi-bit memory, ineffective data for multi-bit memory is deployed if the data is read without inputting key data. Therefore, original writing data is protected and the illegal acquisition of writing data is prevented.

However, a person that knows key data can input key data from external equipment to the command terminal 27 as described above and read data. In this case, since the semiconductor storage device 1 converts multi-bit data stored in the memory cell 11 into single bit data and output the data to the data terminal 22, writing data can be correctly read.

Figure 4A:
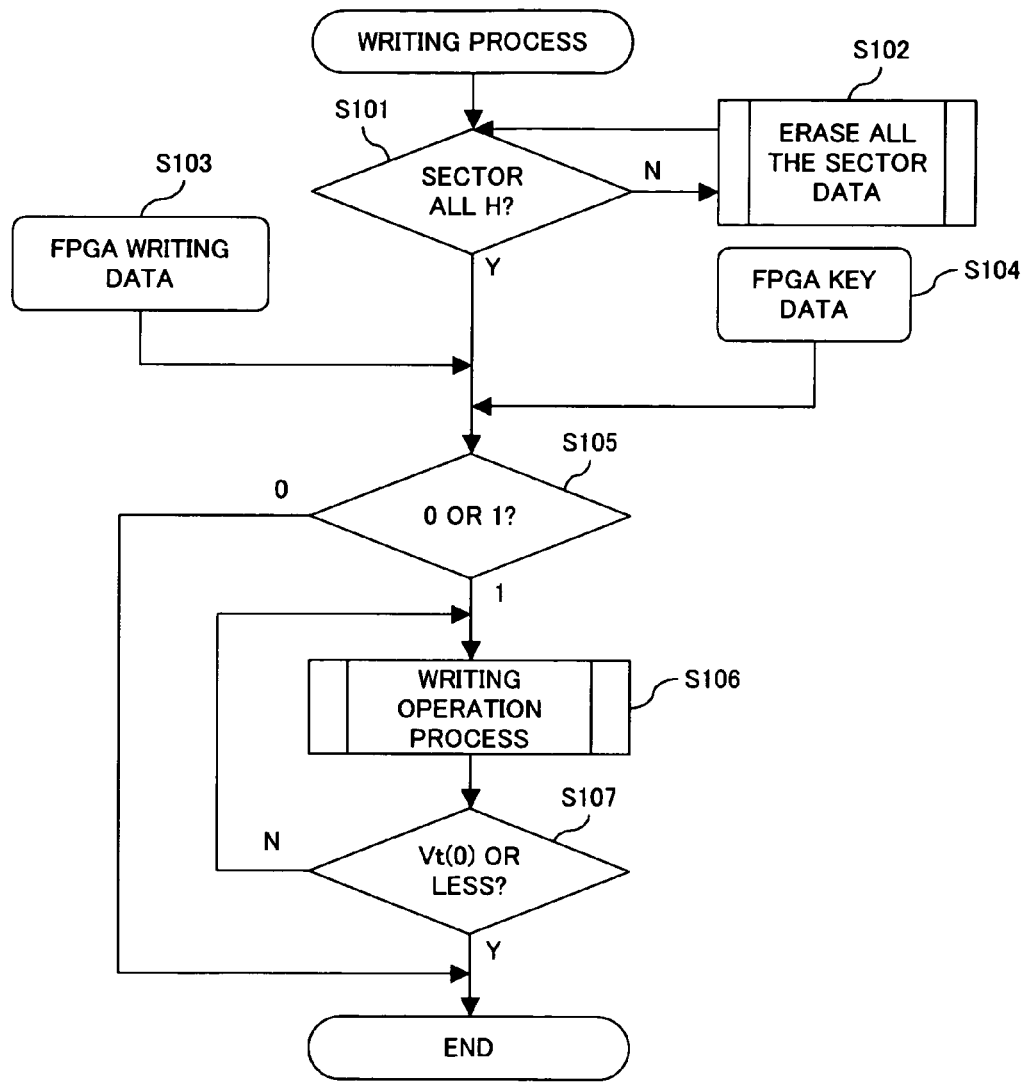
FIG. 4A is a flowchart showing the process contents of a writing process (No. 1).
Figure 4B:
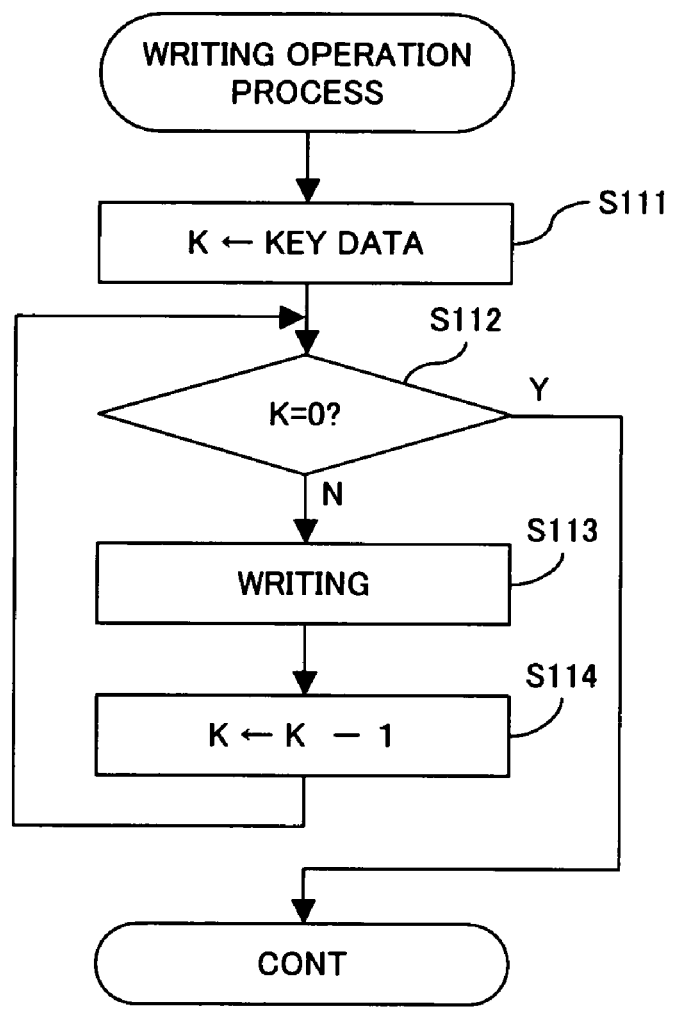
FIG. 4B is a flowchart showing the process contents of a writing process (No. 2).

Next, FIGS. 4A and 4B are described. FIG. 4A is a flowchart showing the process contents of a writing process performed in the data logic 14. FIG. 4B is a flowchart showing the detailed process in S106 shown in FIG. 4A. These processes are applied to each cell to be written in the memory cell 11 and is executed when key data is inputted terminal 27 in the state where the write-enable terminal 23.

In the following description, the memory cell 11 stores the prescribed amount of electric charge in its initial state and realizes data storage by reducing the stored amount of electric charge by a prescribed amount, according to a writing data value. The correspondence between the amount of electric charge and data in each cell when writing or reading data, shown in FIG. 3 is adopted.

Firstly, in S101, as preparation prior to data writing, it is determined whether the respective amount of electric charge of all cells of a sector (block) to which a cell specified by the input of an address to the address terminal 21, of the memory cell 11 are all at a high (H) level. If the all the cell in the sector is not at an H level, in S102 the data of all the cells in the sector is erased (their amount of electric charge is made a tan H level). After that, the determination in S101 is performed again. If in S101 it is determined that all the cells in the sector are at an H level, the process proceeds to S103.

In S103, the writing data inputted to the data terminal 22 from the FPGA 2 is taken in. In S104, key data inputted to the command terminal 27 is taken in. The writing data is temporarily stored in the data bus buffer 33 and the key data is inputted to the command register 34.

In S105, it is determined which the value of a digit to be currently written of the writing data is, "0" or "1". If it is determined that the value is "0", the process shown in FIG. 4A terminates without writing the data in the cell. In this case, since the amount of electric charge of the cell remains in the initial state (that is, at a H level), as shown in FIG. 3, this amount of electric charge indicates "0" and (0, 0) as binary data and four-valued data, respectively.

If in S105 it is determined that the value of a digit to be currently written of the writing data is "1", the writing operation in S106 is performed. It detailed process will be described later.

After S106, in S107 it is determined whether the current reading voltage of the writing destination cell is made equal to or less than a threshold voltage Vt(0) as shown in FIG. 3. If the current reading voltage of the cell is made equal to or less than the threshold voltage Vt(0), it is determined that "1" of binary data can be stored in the writing destination cell and the process shown in FIG. 4A terminates. If the current reading voltage of the cell is not made equal to or less than the threshold voltage Vt(0) yet, the process returns to S106, and the writing operation is performed again.

Next, the writing operation in S106 is described in details with reference to the flowchart shown in FIG. 4B. This process realizes the functions of the writing pulse timer 35 and writing circuit 36 shown in FIG. 2.

Firstly, in S111, a numerical value selected from the key data inputted to the command terminal, that is, a numerical value corresponding to a digit to be currently written of the writing data is assigned to a variable K. As described earlier, the key data is a series of numerical values, and in this case, a part of the numerical value is selected for each digit of the writing data, according to prescribed conditions and is used. The variable K at that time corresponds to the earlier-described writing count data.

In S112, it is determined whether the current value of the variable K is made zero. If the current value of the variable K is made zero, the process shown in FIG. 4B terminates and the process returns to the process shown in FIG. 4A. If the current value of the variable K is not made zero yet, the process proceeds to S113.

In S113, a writing process, that is, a process of reducing the electric charge stored in the cell by a prescribed amount by connecting the signal rectification circuit 13 to a writing destination cell for a prescribed time is performed.

In S114, 1 is deducted from the current value of the variable K and the result is assigned to the variable K again. After that, the process returns to S112 and the above-described process is repeated.

Since as the result of the above-described process, the number of writing in S113 varies with a key data value, the mount of electric charge of a writing destination cell varies. Specifically, by the processes shown in FIG. 4B and in S105 of FIG. 4A, the writing data being binary data "1" is related to one of four-valued values, (0, 1), (1, 0) and (1, 1), according to the key data value.

However, in the case of some numeral key data value, even when writing shown in FIG. 4B is performed, the decrease in the amount of electric charge of a writing destination cell is insufficient. Therefore, in that case, sometimes the output voltage of the cell still remains higher than the earlier-described threshold value Vt(0). In this case, writing data being binary data "1" is related to a four value (0, 0). However, in this case, since the determination in S107 of FIG. 4A becomes no, the writing shown in FIG. 4B is further applied to the writing destination cell. By the repetition of this writing, the writing data being binary data "1" is related to one of four-valued values (0, 1), (1, 0) and (1, 1).

Figure 5:
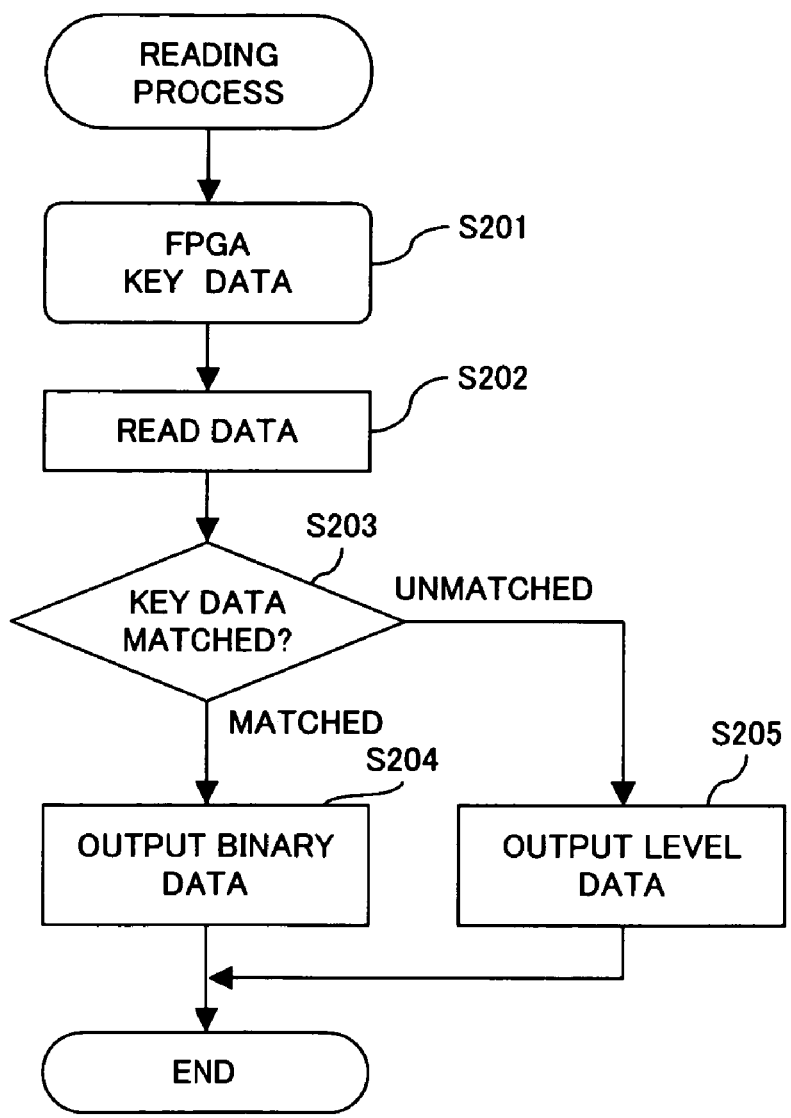
FIG. 5 is a flowchart showing the process contents of a reading process.

Next, FIG. 5 is described. FIG. 5 is a flowchart showing the process contents of a reading process performed by the data logic 34 when key data is inputted to the command terminal 27.

Firstly, in S201 when key data is inputted to the command terminal 27, in S202 storage identification information stored in a specific cell in the memory cell 11 is read and stored in the data bus buffer 33.

In S203, it is determined whether storage identification information stored in the data bus buffer 33 coincides with the earlier-described key data. If it is determined that both are matched, in S204 the decoding circuit 32 is controlled to apply correspondence according to the correspondence in the writing shown in FIG. 4A, that is, the output voltage of the memory cell 11 is related to binary output data. Specifically, if the output voltage of the memory cell 11 is higher than the earlier-described threshold voltage Vt(0), the output voltage is related to a value "0". If it is equal to or less than Vt(0), the output voltage is related to a value "1". Thus, the output voltage value of the memory cell 11, which corresponds to four-valued output data (0, 0) is related to binary output data "0", while the output voltage value of the memory cell 11, which corresponds to four-valued output data, (0, 1), (1, 0) or (1, 1) is related to binary output data "1". Thus, the protected writing data is read.

If in S203 it is determined that both are not matched, in S205 the decoding circuit 32 is controlled to relate the output voltage of the memory cell 11 to four-valued output data. Specifically, the output voltage is related to one of (0, 0), (0, 1), (1, 0) and (1, 1), according to the output voltage value of the memory cell 11. Thus, the protected writing data is read as meaningless data.

Thus, since a third party that does not know key data reads data as four-valued data, writing data can be prevented from being illegally obtained. However, a person that knows key data can correctly read the writing data.

Although so far, the preferred embodiments of the present invention have been described, the present invention is not limited to each of the preferred embodiment. A variety of improvements/modifications are possible unless they deviate from the subject matter of the present invention.

Figure 6:
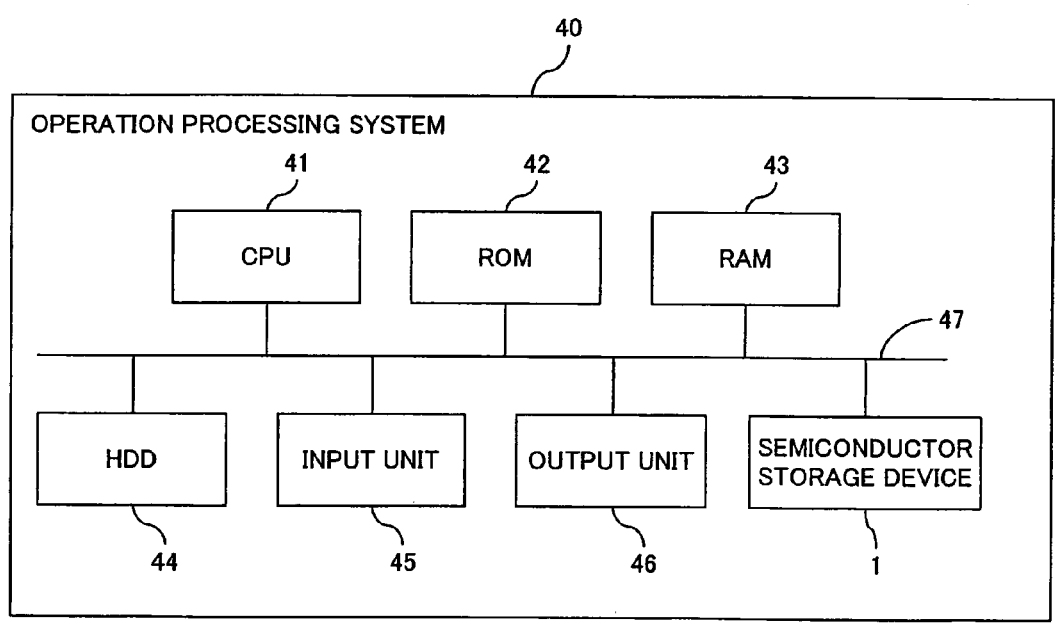
FIG. 6 shows the configuration of the operation processing system using the semiconductor storage device of the present invention.

For example, although in the above-described preferred embodiments, an FPGA 2 is used as external equipment using the semiconductor storage device, instead the semiconductor storage device cal also used in the operation processing system shown in FIG. 6.

FIG. 6 is described below. An operation processing system 40 comprises the same semiconductor storage device 1 as described above. The semiconductor storage device 1 comprises a central processing unit (CPU) 41, read-only memory (ROM) 42, random-access memory (RAM) 43, a hard disk drive (HDD) 44, an input unit 45 and an output unit 46, which are all connected to a bus 47. The semiconductor storage device 1 can also be attached/detached to/from the operation processing system 40.

The CPU 41 is a central processing unit for controlling the operation of this entire operation processing system 40.

The ROM 42 stores in advance a basic control program to be executed by the CPU 41. If the CPU 41 executes this basic control program when starting the operation processing system 40, the basic operation of the entire operation processing system 40 can be controlled by the CPU 41.

The RAM 43 is used as working memory when the CPU 41 executes a variety of control programs, and is also used as main memory used as a temporary storage area of a variety of data.

The HDD 44 is a hard disk device storing in advance a control program for enabling the CPU 41 to execute a variety of control to be executed by this operation processing system 40.

The input unit 45 receives an input from the outside and transfers the contents of the input to the CPU 41. The input unit 41 comprises an input device for receiving instructions from an operator that operates this unit, such as a keyboard, a mouse or the like.

The output unit 46 outputs a variety of information according to instructions fro the CPU 41. The output unit comprises a cathode ray tube (CRT), a liquid crystal display (LCD) or the like.

In the operation processing system 40 with such a configuration, if the CPU 41 executes the control program stored in the HDD 44 or the like and writes/reads data with appropriate key data, like the FPGA 2 shown in FIG. 1, the writing data protection function of the semiconductor storage device 1 can be utilized.

What is claimed is:

1. A semiconductor storage device, comprising:
   a semiconductor storage element comprising a plurality of storage cells each capable of storing a multi-valued information more than a binary one by changing an amount of electric charge to be stored within a storage cell;
   a storage control unit storing storage data, each inputted digit of which is binary, in each of the storage cells as a multi-valued information for each digit;
   a detection unit detecting the amount of electric charge stored in the storage cell;
   a determination unit determining whether the read request is an authorized request;
   a correspondence unit relating the detected amount of electric charge to a binary value based on a predetermined definition when the read request is legal and relating the amount of electric charge equal to the amount of electric charge detected when the read request is legal to the multi-valued value when the read request is illegal; and
   an output unit outputting data obtained by arraying the related value in each digit as storage data requested to read.

2. The semiconductor storage device according to claim 1, wherein
   the determination unit determines whether the read request is legal, by determining whether externally inputted identification information coincides with pre-stored storage identification information.

3. The semiconductor storage device according to claim 1, wherein
   the detection unit detects the amount of electric charge by detecting a voltage value of the storage cell.

4. The semiconductor storage device according to claim 1, wherein
   the storage control unit relates each binary value of each digit of inputted storage data to one of the multi-valued values and stores the related multi-valued value in each of the storage cell, and
   when the read request is legal, the correspondence unit relates the detected amount of electric charge to a binary value, according to the correspondence of the storage control unit.

5. The semiconductor storage device according to claim 4, wherein
   the storage control unit determines the correspondence, based on externally inputted identification information.

* * * * *